(12) United States Patent
Chiba et al.

(10) Patent No.: US 9,282,397 B2
(45) Date of Patent: Mar. 8, 2016

(54) ACOUSTIC SIGNAL CORRECTOR AND ACOUSTIC SIGNAL CORRECTING METHOD

(75) Inventors: Norikatsu Chiba, Tokyo (JP); Kimio Miseki, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 1217 days.

(21) Appl. No.: 13/228,324

(22) Filed: Sep. 8, 2011

(65) Prior Publication Data
US 2012/0063612 A1 Mar. 15, 2012

Related U.S. Application Data

(63) Continuation of application No. 12/949,437, filed on Nov. 18, 2010, now abandoned.

(30) Foreign Application Priority Data

Feb. 23, 2010 (JP) .................................. 2010-037888

(51) Int. Cl.
*H04R 25/00* (2006.01)
*H03G 9/00* (2006.01)
(Continued)

(52) U.S. Cl.
CPC .............. *H04R 1/1091* (2013.01); *G10L 21/02* (2013.01); *H03G 5/005* (2013.01); *H03G 9/005* (2013.01);
(Continued)

(58) Field of Classification Search
CPC ........... H04R 2460/01; H04R 2460/15; H04R 25/353; H04R 25/356; H04R 25/456; H04R 25/505; H04R 25/652; H04R 2225/43; H04R 3/04; H04R 1/1016; H04R 1/1083; H04R 1/1091; H03G 5/005; H03G 5/025; H03G 5/165; H03G 9/005
USPC ......... 381/56, 58, 59, 98, 102, 104, 106, 107, 381/109, 312, 316–318, 320, 321, 328, 381/94.1–94.3, 380, 103, 83, 93; 607/57
See application file for complete search history.

(56) References Cited

U.S. PATENT DOCUMENTS 5,418,859 A 5/1995 Cho
7,953,229 B2 5/2011 Saito et al.
(Continued)

FOREIGN PATENT DOCUMENTS

JP 2741817 6/1998
JP 11133998 5/1999
(Continued)

OTHER PUBLICATIONS

Japanese Patent Application No. 2010-037888; Decision to Grant a Patent; Mailed Feb. 8, 2011 (English Translation).
(Continued)

*Primary Examiner* — Xu Mei
(74) *Attorney, Agent, or Firm* — Rutan & Tucker, LLP; William W. Schaal

(57) ABSTRACT

According to one embodiment, an acoustic signal corrector includes: an output module; a selection receiver; and a holder. The output module is configured to output a plurality of acoustic signals. Amplitude values of frequencies within a frequency band of each of the acoustic signals are emphasized as emphasized amplitude values. A plurality of amplitude values among the emphasized amplitude values are corrected as corrected amplitude values at some of frequencies within the frequency band. Resonance is possibly induced in the frequency band by sealing an ear canal. The selection receiver is configured to receive a selection of one of the acoustic signals output by the output module. The holder is configured to hold, as a configuration for sound quality correction, a configuration corresponding to the correction of the one of the acoustic signals at the some of the frequencies.

19 Claims, 13 Drawing Sheets

(51) Int. Cl.
*H04R 1/10* (2006.01)
*G10L 21/02* (2013.01)
*H03G 5/00* (2006.01)
*G10L 21/0232* (2013.01)

(52) U.S. Cl.
CPC ........... *G10L 21/0232* (2013.01); *H04R 1/1016* (2013.01); *H04R 25/353* (2013.01); *H04R 25/356* (2013.01); *H04R 2460/15* (2013.01)

(56) References Cited

U.S. PATENT DOCUMENTS

| | | | |
|---|---|---|---|
| 8,199,932 B2* | 6/2012 | Nakano | 381/103 |
| 8,238,568 B2* | 8/2012 | Miseki et al. | 381/71.6 |
| 8,577,051 B2* | 11/2013 | Miseki et al. | 381/71.6 |
| 2006/0093159 A1* | 5/2006 | Koh et al. | 381/98 |
| 2008/0013751 A1* | 1/2008 | Hiselius | 381/102 |
| 2008/0260193 A1 | 10/2008 | Westermann et al. | |
| 2008/0317268 A1* | 12/2008 | Nordahn et al. | 381/321 |
| 2009/0208027 A1 | 8/2009 | Fukuda et al. | |
| 2009/0296949 A1 | 12/2009 | Iwata et al. | |
| 2010/0329481 A1 | 12/2010 | Fukuda et al. | |
| 2011/0164772 A1 | 7/2011 | Nishizaki et al. | |
| 2011/0171921 A1* | 7/2011 | Son et al. | 455/296 |

FOREIGN PATENT DOCUMENTS

| | | |
|---|---|---|
| JP | 2006165757 | 6/2006 |
| JP | 2008-177798 | 7/2008 |
| JP | 2009512373 | 3/2009 |
| JP | 2009194769 | 8/2009 |
| JP | 2009-273084 | 11/2009 |
| JP | 2009288555 | 12/2009 |
| JP | 2011-119811 | 6/2011 |
| WO | WO-2007045254 | 4/2007 |

OTHER PUBLICATIONS

Japanese Patent Application No. 2011-044244, Decision of Rejection, mailed Jan. 8, 2013, (with English Translation).
Japanese Patent Application No. 2011-044244, Notice of Rejection, mailed Jul. 3, 2012, (with English Translation).

* cited by examiner

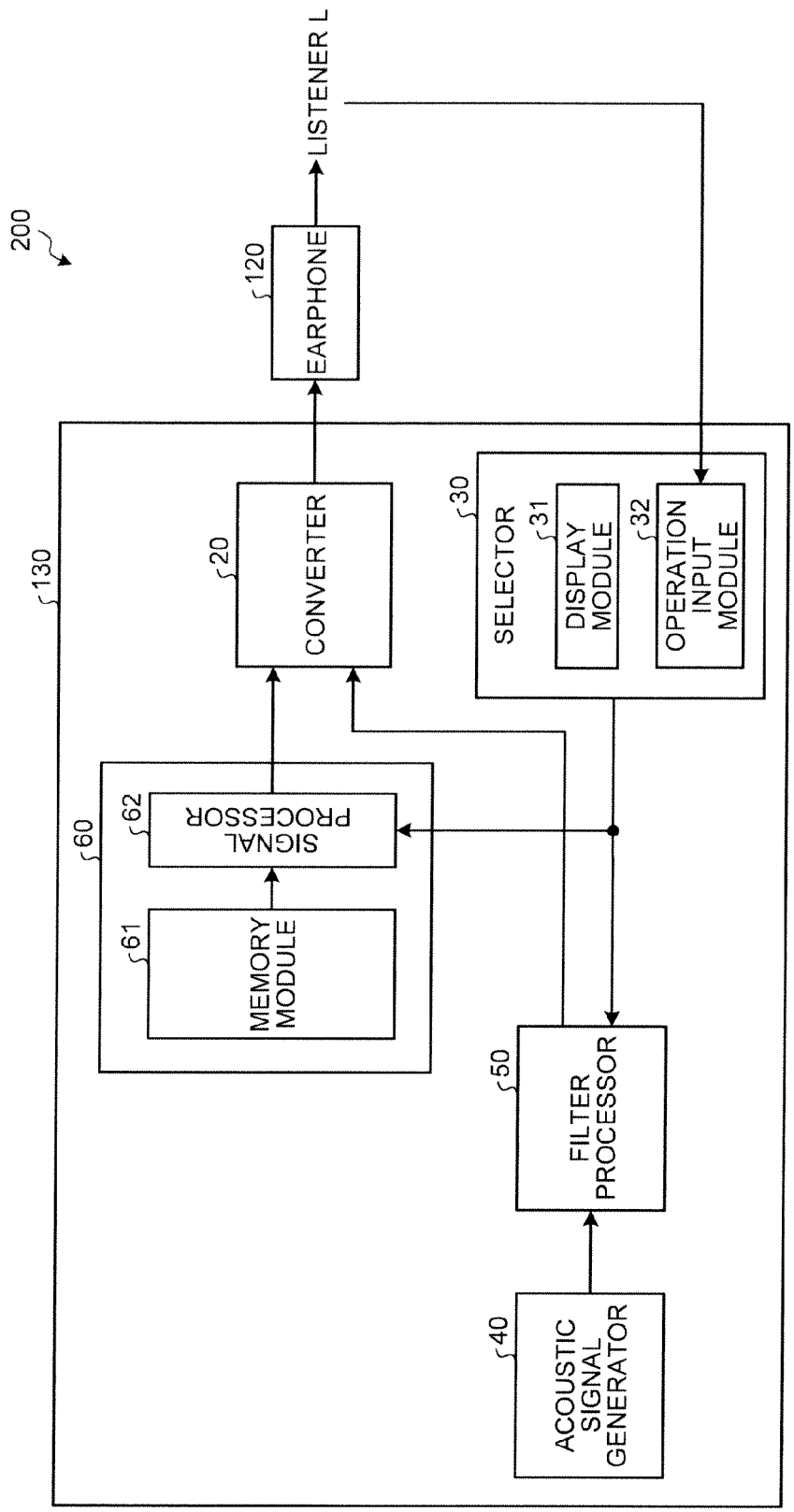

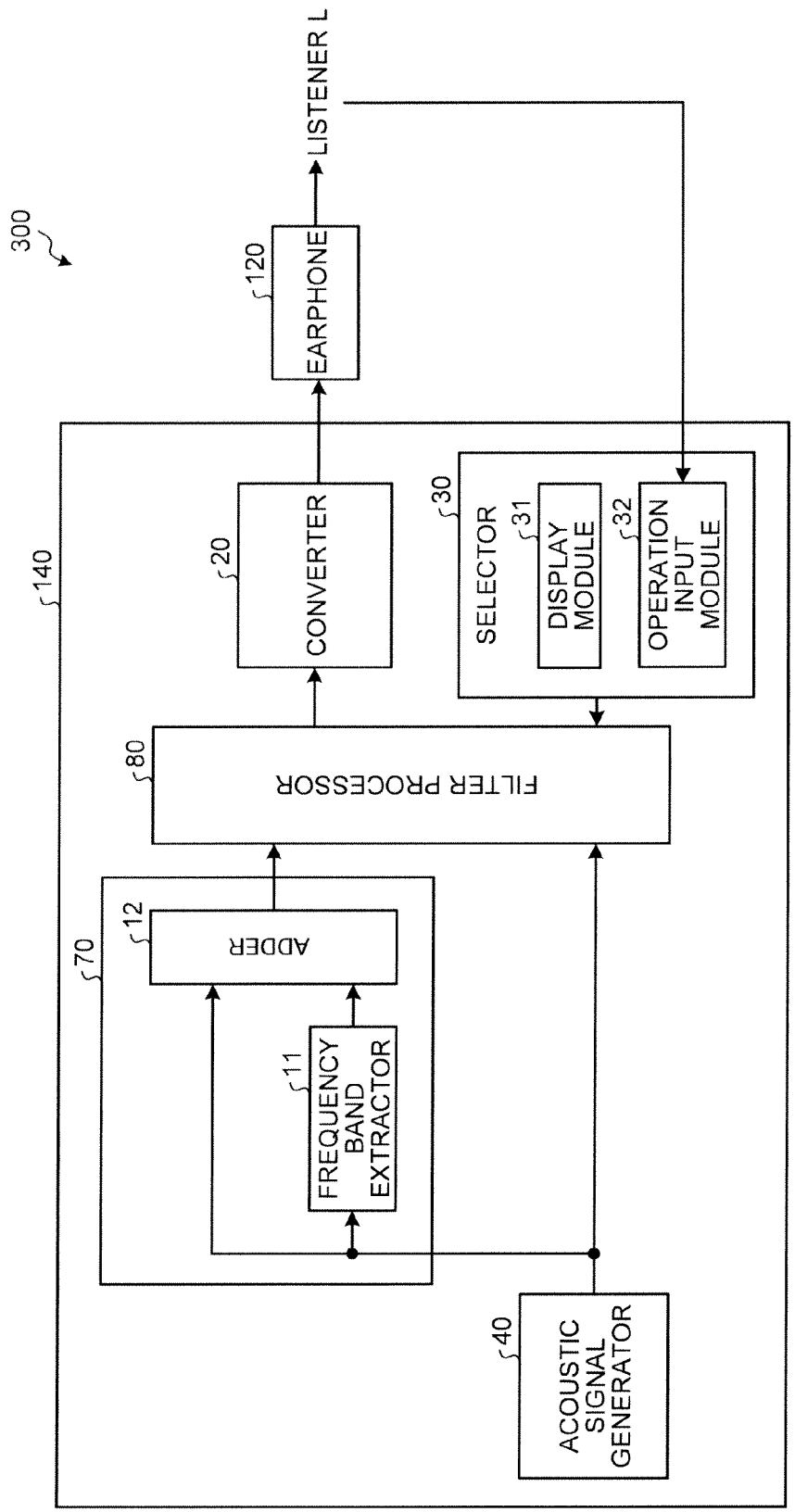

ACOUSTIC SIGNAL CORRECTOR AND ACOUSTIC SIGNAL CORRECTING METHOD

CROSS-REFERENCE TO RELATED APPLICATIONS

This application is a continuation application and is based upon and claims the benefit of priority from U.S. application Ser. No. 12/949,437, filed Nov. 18, 2010 and is based upon and claims the benefit of priority from Japanese Patent Application No. 2010-037888, filed on Feb. 23, 2010, the entire contents of which are incorporated herein by reference.

FIELD

Embodiments described herein relate generally to an acoustic signal corrector and an acoustic signal correcting method.

BACKGROUND

When a user listens to music with earphones or headphones, the sound resonates in ear canals of the user by sealing the ear canals with the earphones or the headphones. The resonance phenomenon causes the user to hear an unnatural sound or the like. To avoid such unnatural sound, there has been proposed a technology aimed to suppress the resonance phenomenon in the space formed by the ears and the earphones or the headphones.

For example, Japanese Patent Application Publication (KOKAI) No. 2009-194769 discloses a conventional technology for cancelling a peak (resonance peak) of a resonant frequency detected by earphones for measurement provided with a microphone. According to the conventional technology, a sound source signal is output from the earphones. While the earphones are placed in the ear canals, the microphone picks up sound to obtain the frequency characteristics of the acoustic signals. The resonant frequency of the ear canal is detected from the frequency characteristics to reduce the resonant frequency. Further, Japanese Patent No. 2741817 discloses a conventional technology for alleviating discomfort of the user when the headphones are placed and the ear canals are sealed. According to the conventional technology, transfer functions that are different for each individual are clustered to reduce a number of types of filter coefficients of a filter for controlling auditory lateralization. This eases the listener's setup burden.

However, the above conventional technologies require hardware for measuring the sound in the ear canals, thereby increasing the cost for providing the hardware. Further, typically, it is difficult to find such hardware. Still further, the above conventional technologies require a listening test for at least sixteen times to determine an appropriate filter coefficient. Hence, the setup of the filter coefficient is still complex. Further, because sometimes the difference between the different setups is very small, it is very difficult to recognize the difference between the sound qualities under the different setups.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 16 is a block diagram of another configuration of the acoustic reproducer in the embodiment; and FIG. 17 is a block diagram of still another configuration of the acoustic reproducer in the embodiment.

DETAILED DESCRIPTION

In general, according to one embodiment, an acoustic signal corrector comprises: an output module; a selection receiver, and a holder. The output module is configured to output a plurality of acoustic signals. Amplitude values of frequencies within a frequency band of each of the acoustic signals are emphasized as emphasized amplitude values. A plurality of amplitude values among the emphasized amplitude values are corrected as corrected amplitude values at some of frequencies within the frequency band. Resonance is possibly induced in the frequency band by sealing an ear canal. The selection receiver is configured to receive a selection of one of the acoustic signals output by the output module. The holder is configured to hold, as a configuration for sound quality correction, a configuration corresponding to the correction of the one of the acoustic signals at the some of the frequencies.

According to another embodiment, an acoustic signal correcting method comprises: outputting, by an output module, a plurality of acoustic signals, amplitude values of frequencies within a frequency band of each of the acoustic signals being emphasized as emphasized amplitude values, a plurality of amplitude values among the emphasized amplitude values being corrected at some of frequencies within the frequency band, resonance being possibly induced in the frequency band by sealing an ear canal; receiving, by a selection receiver, a selection of one of the acoustic signals output by the output module; and holding, by a holder, as a configuration for sound quality correction, a configuration corresponding to the correction of the one of the acoustic signals at the some of the frequencies.

In the following, embodiments of an acoustic signal corrector and an acoustic signal correcting method are explained in details with reference to the attached drawings. In the following, an acoustic signal corrector and an acoustic signal correcting method that are applied to an acoustic processor such as a portable audio player are explained; however, the application of the acoustic signal corrector and the acoustic signal correcting method are not limited to the acoustic processor.

Figure 1:
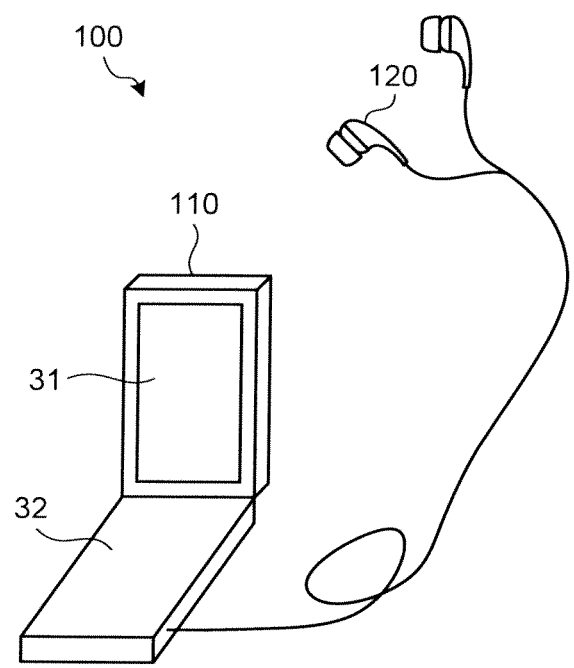
FIG. 1 is an exemplary schematic diagram of an acoustic processor according to an embodiment.

FIG. 1 is a perspective view illustrating an example of an acoustic processor 100 according to an embodiment. As illustrated in the drawing, the acoustic processor 100 comprises an acoustic reproducer 110 and an earphone 120.

The acoustic reproducer comprises a clamshell housing formed of two parts connected to each other by a hinge not illustrated. A display module 31 described later is provided to an inner surface of one of the two parts, and an operation input module described later is provided to an inner surface of other one of the two parts. The earphone 120 is a canal type earphone or the like, and used while being placed in a listener's ear. In the present embodiment, the canal type earphone is explained as the earphone 120. However, the earphone 120 can be of other type, or can be a headphone.

Figure 2:
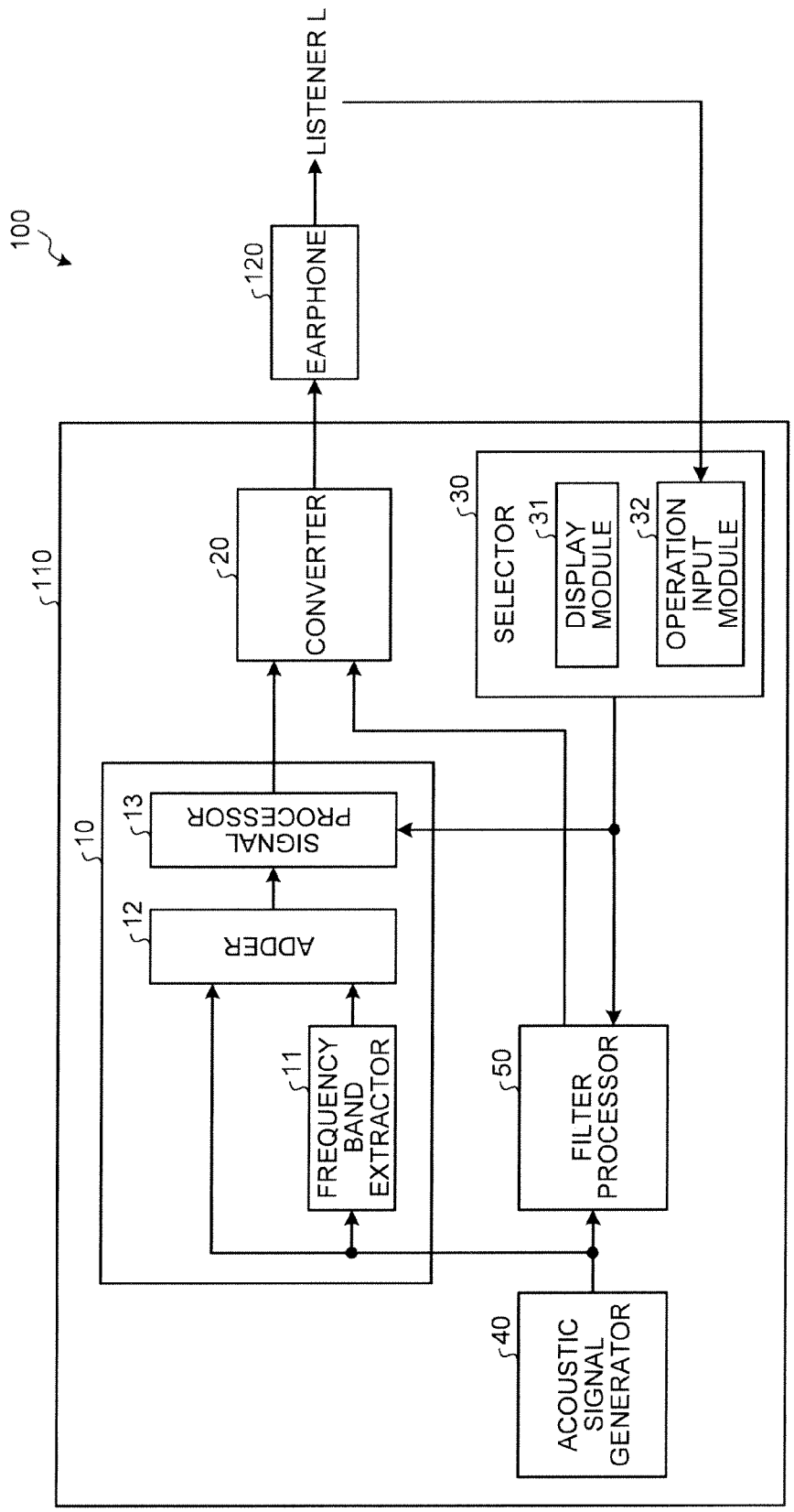
FIG. 2 is an exemplary block diagram of one configuration of an acoustic reproducer in the embodiment.

FIG. 2 is a block diagram of a configuration of the acoustic reproducer 110. As illustrated in FIG. 2, the acoustic reproducer 110 comprises a test signal generator 10, a converter 20, a selector 30, an acoustic signal generator 40, and a filter processor 50. The test signal generator 10 comprises a frequency band extractor 11, an adder 12, and a signal processor 13.

The frequency band extractor 11 is a high pass filter, a band pass filter, or the like, and extracts components of a certain frequency band with respect to a test acoustic signal (test signal) output from the acoustic signal generator 40. In the following, with reference to FIGS. 3 to 5, the frequency band that is to be extracted by the frequency band extractor 11 is explained.

Figure 3:
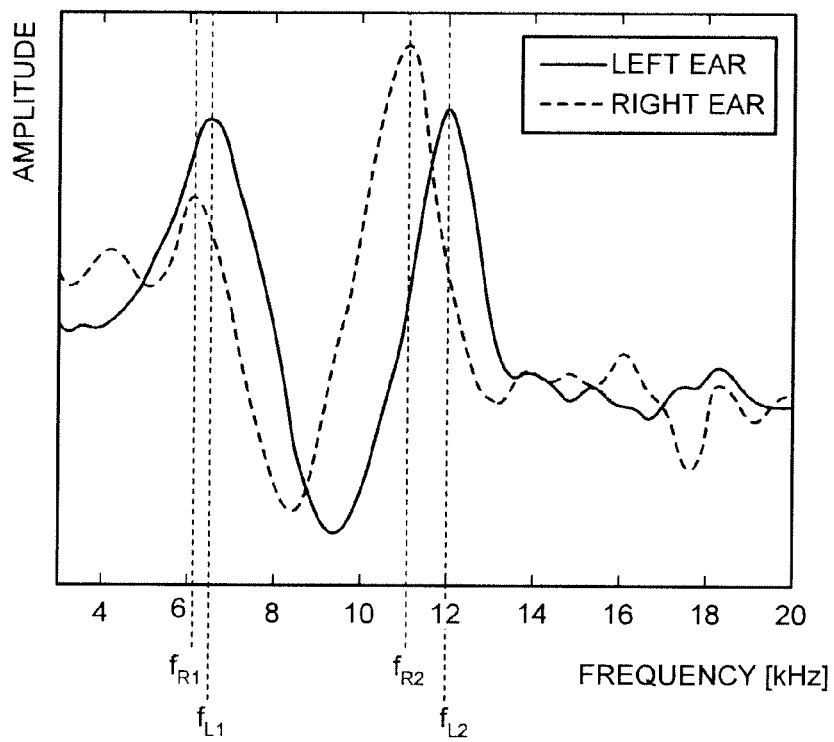
FIG. 3 is an exemplary graph of a result of measurement of resonance in an ear canal in the embodiment.

As described above, when a listener L places the earphone 120 in the ear to listen to the sound, resonance is induced within a closed space formed inside an ear of the listener L including an ear canal and formed with the ear and the earphone 120. FIG. 3 is a graph of an example of results of measurements on the state of resonance induced within the ear canal of a subject (listener L) wearing the earphone 120.

The graph illustrated in FIG. 3 illustrates results of measurements on resonance characteristics of a right ear of the subject as an ear property of the right ear of the subject, and results of measurements of resonance characteristics of a left ear of the subject as an ear property of the left ear of the subject. The horizontal axis of FIG. 3 represents frequency, and the vertical axis represent amplitude (gain) of the frequency. As understood from FIG. 3, resonance peaks are measured as the amplitudes of frequencies for each of the left ear and the right ear, and the resonance peaks represents the resonances in the ears.

In particular, the frequency characteristics of the left ear represented by the solid line in FIG. 3 comprises peaks (resonance peaks) near frequency positions represented by $f_{L1}$ and $f_{L2}$, which are caused by the resonance phenomenon. Further, the frequency characteristic of the right ear represented by the dotted line in FIG. 3 comprises resonance peaks near frequency positions represented by $f_{R1}$ and $f_{R2}$, which are also caused by the resonance phenomenon. In the embodiment, lower ones ($f_{L1}$, $f_{R1}$) of the resonant frequencies of the each ear corresponding to the amplitudes of the resonance peaks are referred to as first resonant frequencies, and higher ones ($f_{L2}$, $f_{R2}$) of the resonant frequencies are referred to as second resonant frequencies.

A shape of a human ear differs for each individual, thereby the ear property of the human ear differs for each individual. Hence, the characteristic of the resonance induced when the earphone is in place of the human ear differs for each individual. Therefore, the results of the measurements of the resonance characteristics of when the earphone is in place for a number of people have been analyzed, and it is found that the resonance peaks appear for frequencies within a frequency band higher than 5 kHz.

Figure 4:
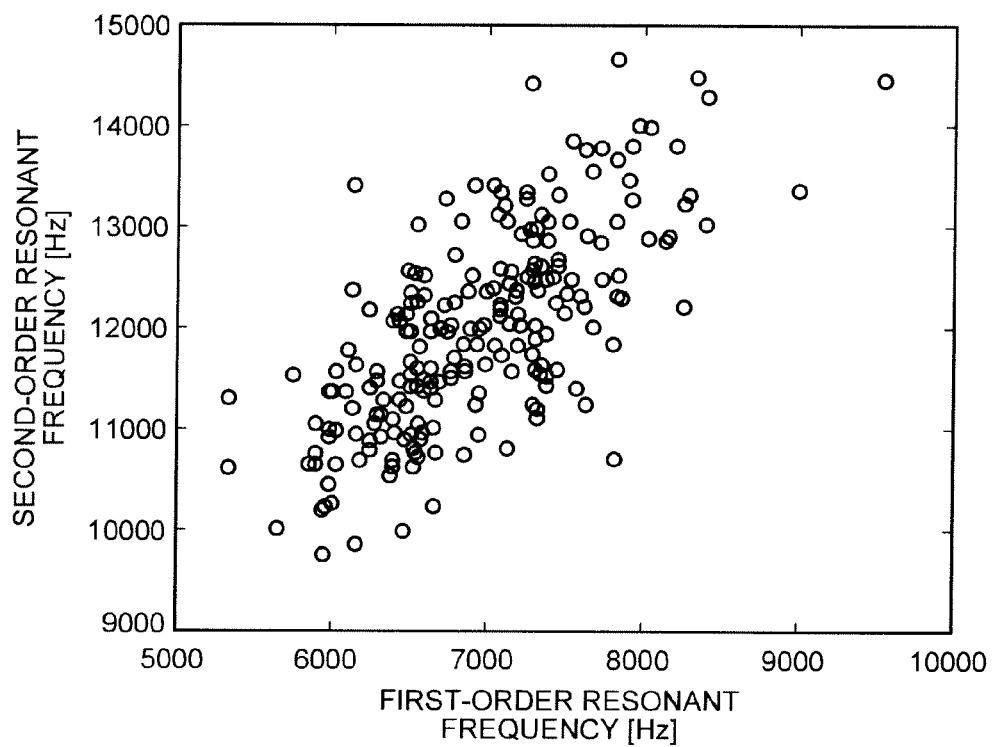
FIG. 4 is a graph of a first resonant frequency and a second resonant frequency of left ears of multiple subjects in the embodiment.
Figure 5:
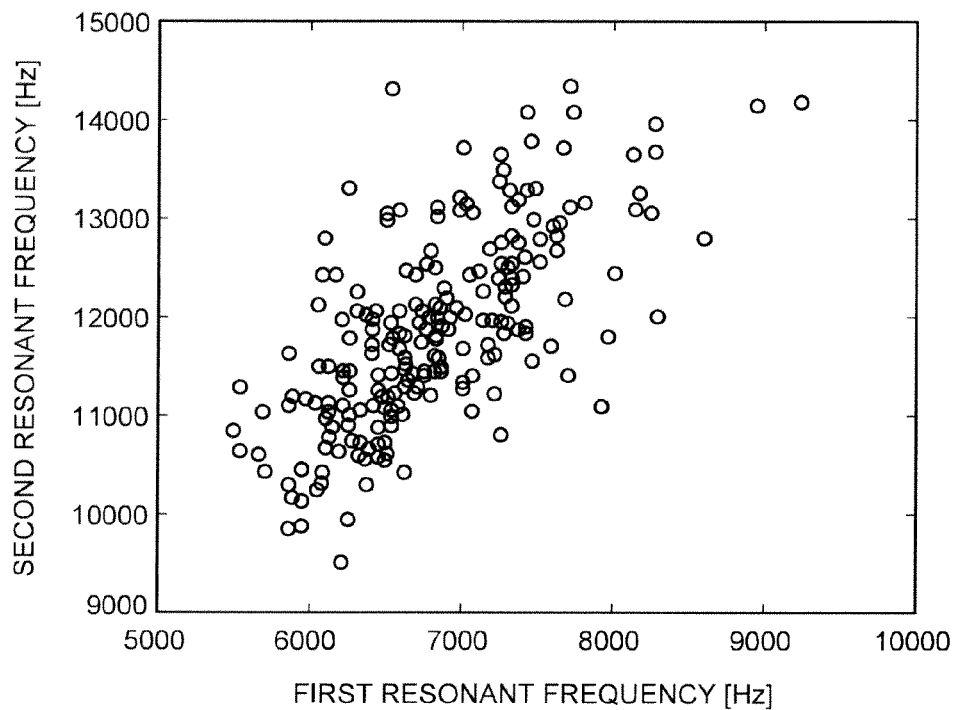
FIG. 5 is a graph of a first resonant frequency and a second resonant frequency measured from right ears of multiple subjects in the embodiment.

FIGS. 4 and 5 are graphs illustrating a relationship between the first resonant frequency and the second resonant frequency of the ears (left ear, right ear) of a number of subjects wearing the earphone 120. FIG. 4 is a graph illustrating a relationship between the first resonant frequency and the second resonant frequency induced in the left ear of each of the subjects. The horizontal axis of FIG. 4 represents distribution of the first resonant frequency, and the vertical axis of FIG. 4 represents distribution of the second-order resonant frequency. FIG. 5 is a graph illustrating a relationship between the first resonant frequency and the second resonant frequency induced in the right ear of each of the subjects. The horizontal axis of FIG. 5 represents distribution of the first resonant frequency, and the vertical axis represents distribution of the second resonant frequency.

In view of the measurement result illustrated in FIGS. 4 and 5, the first resonant frequencies are distributed substantially between 5 kHz and 9 kHz. Further, the second resonant frequencies are distributed substantially between 10 kHz and 14 kHz. Hence, the frequency band extractor 11 extracts components of frequencies within the frequency band within which the resonance is possibly induced by sealing the ear canal, i.e., of the frequency band (5 kHz to 14 kHz) comprising the aforementioned first resonant frequencies and the second resonant frequencies. In the following, the frequency band in which the resonance is possibly induced by sealing the ear canal is referred to as a resonant frequency band.

Figure 6:
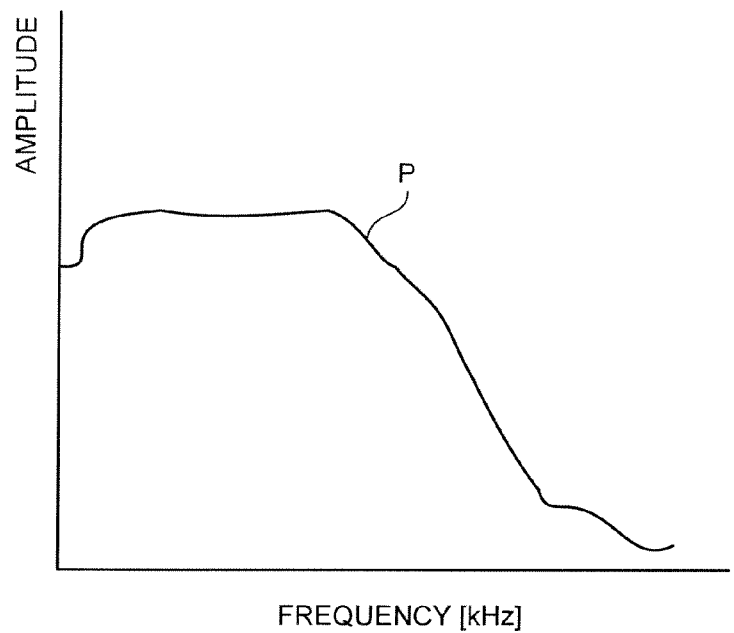
FIG. 6 is a graph of frequency characteristic of a test signal in the embodiment.
Figure 7:
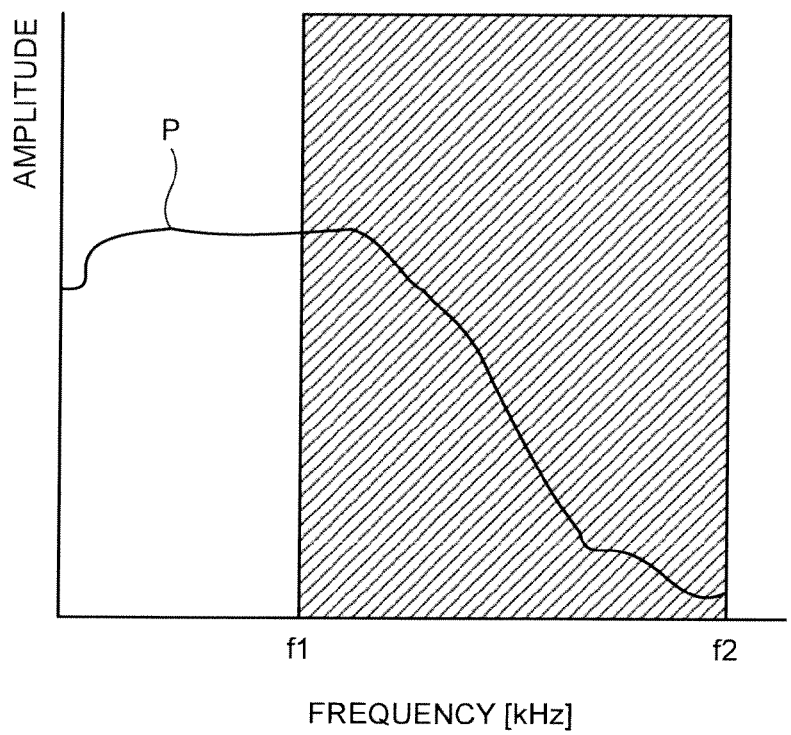
FIG. 7 is a graph for explaining an operation of a frequency band extractor in the embodiment.

For example, when the test signal is represented by the frequency property P in FIG. 6, the frequency band extractor 11 extracts components (amplitude values) of the frequencies within the frequency band between f1 and f2 comprising the first resonant frequency and the second resonant frequency, as illustrated in FIG. 7. Here, FIG. 6 is a graph illustrating one example of the frequency property of the test signal, and FIG. 7 is a graph for explaining operation of the frequency band extractor 11. In these figures, the horizontal axis represents frequency, and the vertical axis represents amplitude (gain) of the frequency.

Figure 8:
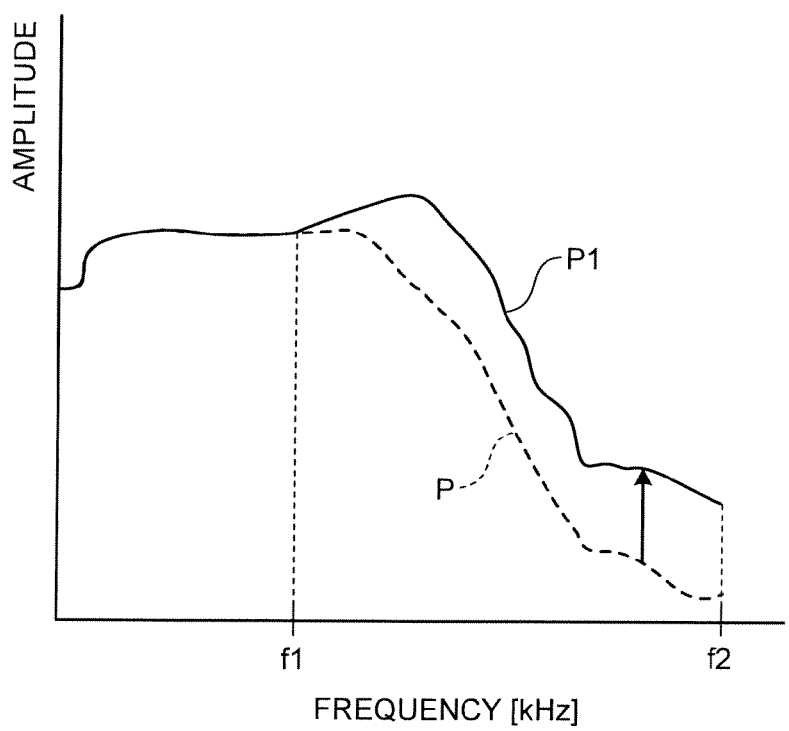
FIG. 8 is a graph for explaining an operation of an adder in the embodiment.

Referring back to FIG. 2, the adder 12 is an adder, an amplifier, and/or the like, and adds the components of frequencies within the certain band extracted by the frequency band extractor 11 to the test signal. Then, the adder 12 outputs it to the signal processor 13. For example, when the components extracted by the frequency band extractor 11 are the components of the frequencies within the band between f1 and f2 of FIG. 7, the adder 12 adds these components to the frequency property P to generate the frequency property P1 as illustrated by the solid line in FIG. 8. That is to say, the adder 12 cooperates with the frequency band extractor 11 to amplify the amplitude values of frequencies within the resonant frequency band included in the test signal. Here, FIG. 8 is a graph for explaining the operation of the adder 12. The dotted line of FIG. 8 represents the frequency property P before the addition. The amount of addition (amplification) with respect to the frequency property P can be set to an arbitrary value.

It is generally known that resolution of the human ear is relatively low for the sound within the resonant frequency band comprising the first resonant frequency and the second resonant frequency, as described later. Therefore, even when uncomfortable sound due to the resonance phenomenon is heard, it is difficult to determine a particular frequency band that is causing the discomfort. Hence, the adder 12 cooperates with the frequency band extractor 11 to amplify the amplitude values of frequencies within the resonant frequency band to demodulate the test signal so that the change in the sound quality due to the resonance phenomenon can easily be determined.

In the embodiment, the amplitude values of the frequencies within the resonant frequency band are amplified to emphasize the components of the frequencies within the resonant frequency band. However, the present embodiment is not limited thereto, and instead of amplifying the amplitude values of the frequencies within the resonant frequency band, components of the frequencies other than that of the frequencies within the resonant frequency band can be reduced to emphasize the components of the frequencies within the resonant frequency band. In this case, for example, a test signal input to the test signal generator 10 and to which multiplication is applied is input to the adder 12 as one of the input for the adder 12, and components of the test signal of frequencies other than that of the frequencies within the resonant frequency band extracted by the frequency band extractor 11 are attenuated. Consequently, the components of the frequencies within the resonant frequency band can be emphasized. On the other hand, the components of the frequencies of the test signal other than the components of the frequencies within the resonant frequency band of the test signal can be extracted by using the frequency band extractor 11 realized by a low pass filter, band pass filter, or the like. In this case, a subtractor is used instead of the adder 12 to subtract the components of the frequencies of the test signal other than the components of the frequencies within the resonant frequency band of the test signal and extracted by the frequency band extractor 11. Consequently, the components of the frequencies within the resonant frequency band can be emphasized. Further, instead of the adder 12 and the frequency band extractor 11, the same function can be realized by a filter having a frequency property for emphasizing the resonant frequency band.

Referring back to FIG. 2, the signal processor 13 performs signal processing on the test signal input from the adder 12 to change the frequency property of the test signal, and output the test signal to the converter 20. In particular, the signal processor 13 corrects a portion of the frequency property to which the addition is performed by the adder 12, by using one of correction filters with a frequency property selected by the listener L through the selector 30. Here, each of the correction filters has different frequency property. Further, it is assumed that a circuit for the signal processing according to each frequency property is preliminarily embedded in the signal processor 13.

Figure 9:
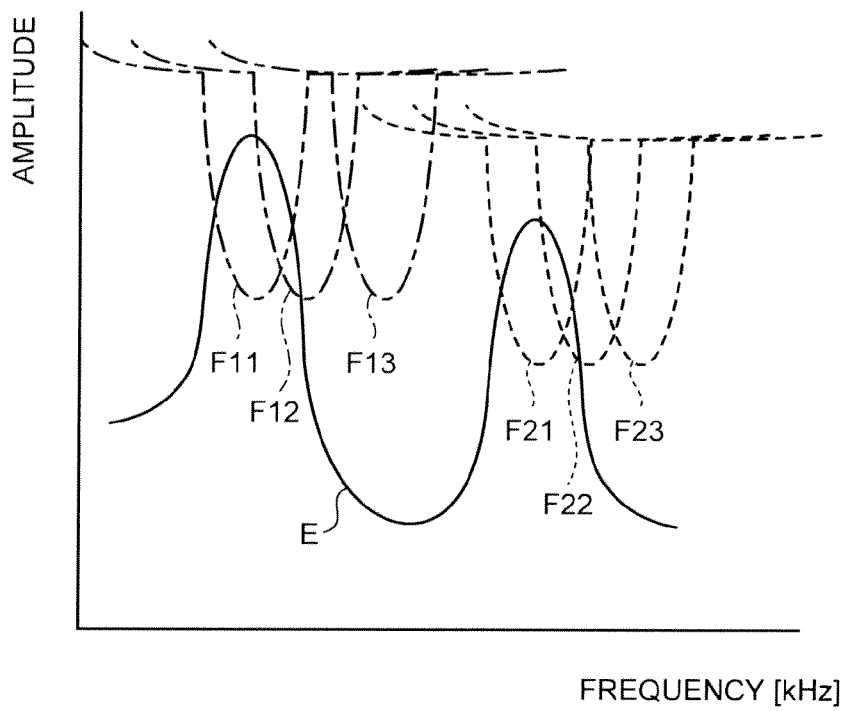
FIG. 9 is a graph for explaining a principle of a correction filter used in a signal processor in the embodiment.

FIG. 9 is a graph for explaining a principle of the correction filter used in the signal processor 13. In FIG. 9, the solid line represents an ear property E of the listener L wearing the earphone 120. The dotted line represents a frequency property of the correction filter. Correction filters F11 to F13 are for suppressing (reducing) the resonance peak at the first resonant frequency, and correction filters F21 to F23 are for suppressing the resonance peak at the second resonant frequency. In FIG. 9, the horizontal axis represents frequency and the vertical axis represents amplitude (gain) of the frequency.

As illustrated in FIG. 9, the correction filter used by the signal processor 13 is a frequency filter for suppressing the resonance peaks at the first resonant frequency and the second resonant frequency. The signal processor 13 comprises a plurality of types of correction filters each having different major frequency. The signal processor 13 uses one of the correction filters that corresponds to a selection signal from the selector 30 to change the frequency property of the test signal output from the adder 12.

Figure 10:
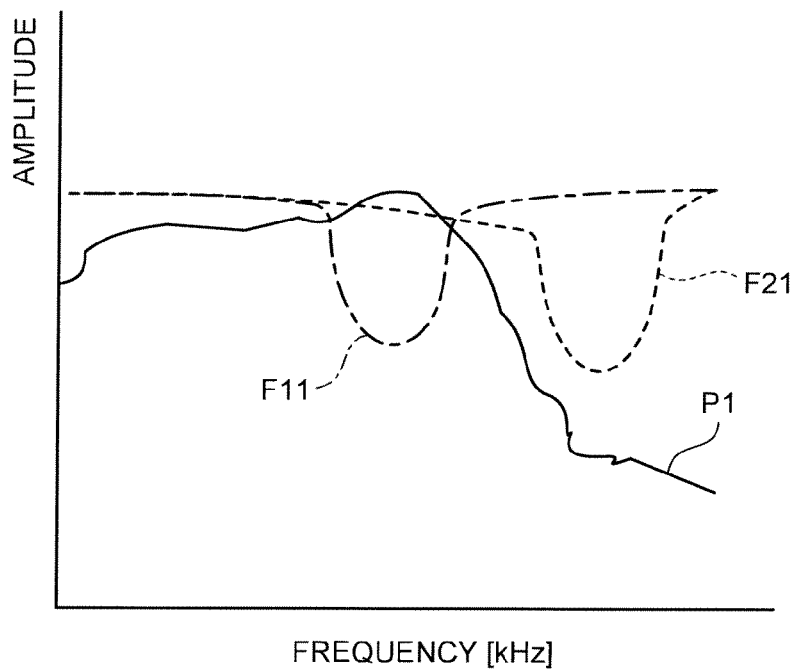
FIG. 10 is a graph for explaining an operation of the signal processor in the embodiment.

For example, when the test signal with the frequency property P1 illustrated in FIG. 8 is output from the adder 12, and when the correction filters F11 and F21 are selected through the selector 30, the signal processor 13 changes the frequency property P1 by the correction filters F11 and F21, as illustrated in FIG. 10. Here, FIG. 10 is a graph for explaining operation of the signal processor 13.

In general, it is known as a property of human ear that the frequency resolution decreases as the frequency increases. Therefore, when the filter coefficients of the correction filters are determined, the major frequencies of the correction filters do not necessarily have to be precisely matched with each of the resonant frequencies of the listener L.

In this regard, an experiment was performed to compare a case when the central frequency of the correction filter and the resonant frequency are precisely matched with each other and a case when the central frequency of the correction filter is arranged at a frequency position off from the resonant frequency by substantially 500 Hz in positive or negative direction. As a result, it is confirmed that a difference in sound quality between the two cases cannot be distinguished. Further, since the frequency band of the second resonant frequency belongs to higher range, the matching can be performed with even less accuracy with respect to the matching for the frequency band of the first resonant frequency.

Therefore, for example, five types of correction filters based on the distribution of FIGS. 4 and 5 are enough to suppress the resonance peak of the first resonant frequency to obtain sufficient effect. Here, the five types of the correction filters comprises: a first type with the lowest frequency of 5 kHz; a second type with a frequency of 6 kHz; and the rest of subsequent types with frequencies each incremented by 1 kHz from that of the previous type. Further, in order to suppress the resonance peak due to the second resonant frequency, a correction filter with even less accuracy can be used to obtain sufficient effect.

The signal processor 13 may comprise a plurality of types of correction filters for at least one of the resonance peak (first resonance peak) induced by the first resonant frequency and the resonance peak (second resonance peak) induced by the second resonant frequency. Further, the signal processor 13 may comprise a plurality of types of correction filters capable of simultaneously suppressing the first resonance peak and the second resonance peak. It can be understood from the distributions of FIGS. 4 and 5 that the second-order resonant frequency increases as the first resonant frequency increases. Thus, there is a strong positive correlation between the first resonant frequency and the second resonant frequency. In view of this correlation, a number of combinations of filter coefficients suppressing both of the first resonance peak and the second resonance peak can be decreased.

For example, from FIG. 4, it can be understood that a person who undergoes the second-order resonance phenomenon induced near 12 kHz also undergoes the first resonant phenomenon at 7 kHz. In this case, there are almost none of the second-order resonant phenomenon less than or equal to 10 kHz and more than 14 kHz. Hence, in order to suppress the second resonance phenomenon, three types of correction filters with major frequencies between 11 kHz and 13 kHz may be used. Further, in view of the low frequency resolution at the higher frequency band, a correction filter with a major frequency of 12 kHz can be used, for example, for the second-order resonant frequency.

Figure 11:
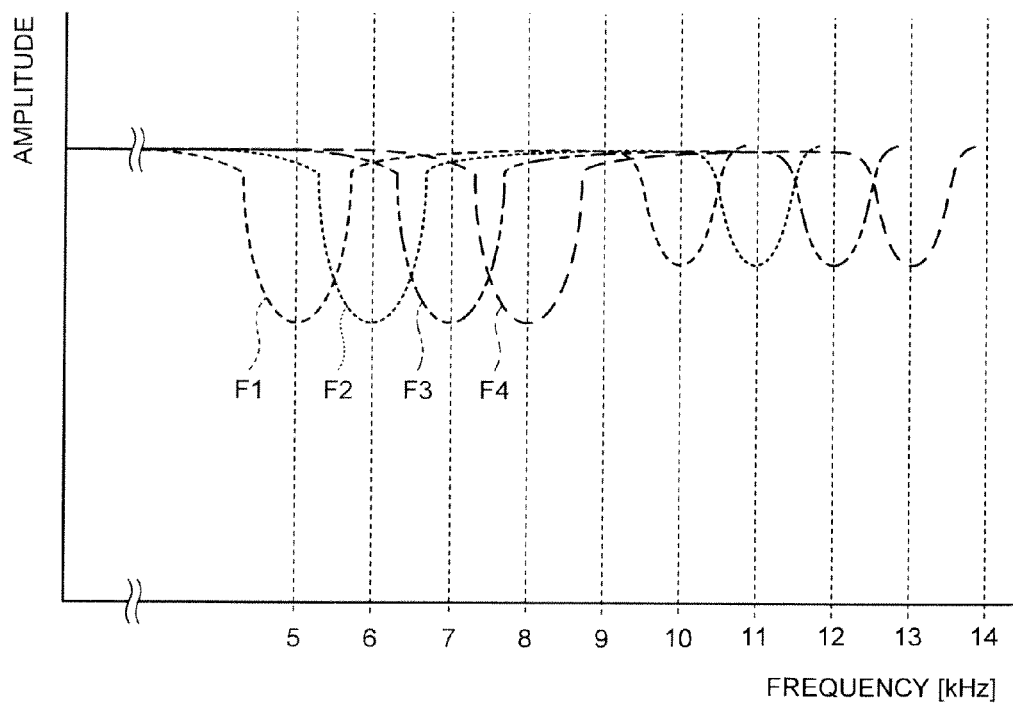
FIG. 11 is a graph illustrating each correction filter of the signal processor in the embodiment.

As mentioned above, when the correction filter configured to simultaneously suppress the first resonance peak and the second resonance peak is used, a number of types of the correction filters can be decreased. In the present embodiment, as illustrated in FIG. 11, the signal processor 13 comprises: a correction filter F1 configured to suppress resonance peaks at 5 kHz band and 10 kHz band; a correction filter F2 configured to suppress resonance peaks at 6 kHz band and 11 kHz band; a correction filter F3 configured to suppress resonance peaks at 7 kHz band and 12 kHz band; and a correction filter F4 configured to suppress resonance peaks at 8 kHz band and 13 kHz band. Each of the correction filters can be generated by a known method, and amplitude and band width forming an inverted peak for the each of the correction filters can be set to arbitrary values.

Referring back to FIG. 2, the converter 20 converts the test signal output from the test signal generator 10 (signal processor 13) or the acoustic signal output from the filter processor 50 to an electric signal, and output it to the earphone 120. Then, at the earphone 120, the electric signal input from the converter 20 is converted to the sound audible for the listener L. Consequently, the listener L can listen to the sound generated by the earphone 120 by placing the earphone 120 in the ears. Further, the listener L can change sound quality to any desired one by selecting a correction filter used for the correction of the sound signal through a later-described user interface (UI) provided by the selector 30 based on sound (test sound) generated by the electric signal converted from the test signal.

The selector 30 is configured of a microprocessor, a read only memory (ROM), a random access memory (RAM), and the like, and comprises the display module 31 and an operation input module 32. The display module 31 is configured of a display device such as a liquid crystal display (LCD) or an organic electroluminescence, and displays information on the acoustic signal generated by the acoustic signal generator 40 and/or a predetermined UI, under the control of the selector 30. The operation input module 32 is configured of an input device such as various types of buttons and/or a touch panel, and receives input operation of the listener L.

Further, when the selector 30 receives the input operation for starting to change the configuration of the sound quality correction through the operation input module 32, the selector 30 displays the UI on the display module 31 to prompt the listener L to select the correction filter used for the correction of the sound signal. Then, the selector 30 outputs the selection result of the correction filter received through the operation input module 32 to the test signal generator 10 (signal processor 13) and the filter processor 50 as a selection signal.

Figure 12:
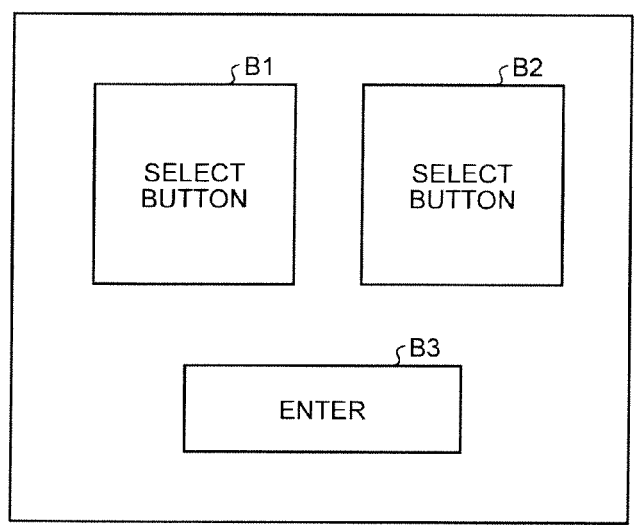
FIG. 12 is a diagram illustrating a user interface provided by a selector in the embodiment.

FIG. 12 is a diagram illustrating one example of the UI provided by the selector 30. In FIG. 12, selection buttons B1 and B2 (selection items) are for receiving a selection of a correction filter. When the selection button B1 or the selection button B2 is pressed, the selector 30 outputs a selection signal which is an instruction for selecting a correction filter with a property associated with the pressed button, to the signal processor 13 and the filter processor 50. An enter button B3 is for providing an instruction to determine the selection of the correction filter. Here, the selector 30 preliminarily holds information (for example, a filter name, a filter coefficient, and the like of each of the correction filters) specifying each of the correction filters F1 to F4.

The selection buttons B1 and B2 and the enter button B3 are operated by using various buttons of the operation input module 32, a touch panel, or the like. A pointer, cursor, or the like displayed by the display module 31 may be operated by various buttons or a touch pad of the operation input module 32 to press the selection buttons B1 and B2 and the enter button B3. When the display module 31 also comprises a function as the touch panel, the selection buttons B1 and B2 and the enter button B3 can directly be pressed.

In particular, the selector 30 divides a group of correction filters by a number of selection buttons displayed on the UI to generate a plurality of groups (first-order filter groups). Then, the selector 30 selects one correction filter from each of the first-order filter groups as a representative of the each of the first-order filter groups, and assigns information for specifying the first-representative filter to each of the selection buttons.

In order to easily determine the change in the sound quality, the correction filters selected as the first-order representative filters from the first-order filter groups, respectively, are preferred not to be adjacent to each other with respect to a central frequency of a group of a successive correction filters. Further, when at least one of the first-order filter groups comprises greater than or equal to three correction filters, it is preferred to select, as the first-order representative filter, one of the correction filters with a central frequency having an intermediate value within the first-order filter group. The same above explanation can be applied for a selection of a second and subsequent order representative filter.

Upon receipt of the press down operation of the operation button to which the first-order representative filter is assigned, the selector 30 outputs the selection signal corresponding to the instruction to specify the first-order representative filter assigned to the selection button, to the signal processor 13 and the filter processor 50. Further, the selector 30 determines whether the first-order filter group to which the first-order representative filter belongs comprises a plurality of correction filters. Then, when the first-order filter group comprises a plurality of correction filters, the selector 30 generates a plurality of groups (second-order filter group) by dividing the group of the correction filters by a number of selection buttons displayed on the UI. Subsequently, the selector 30 selects, as a representative, one correction filter from each of the second-order filter groups, and assigns information specifying the second-order representative filter to each of the selection buttons.

Upon receipt of the press down operation of the selection button to which the second-order representative filter is assigned, the selector 30 outputs the selection signal specifying the second-order representative filter assigned to the selection button, to the signal processor 13 and the filter processor 50. Further, as similar to the case described above, when the second-order filter group to which the second-order representative filter belongs comprises a plurality of correction filters, the selector 30 divides the second-order filter groups. Further, the selector 30 assigns representative filters (third-order representative filters) selected from each of groups (third-order filter groups) to each of the selection buttons, respectively. Further, when the correction filters can further be divided up to the groups, the selector 30 repetitively performs the aforementioned division and the selection of the representative filters for the fourth-order filter groups and any subsequent groups.

When assigning the representative filter to the selection button, identification information (for example, a name of correction filter, a central frequency of a correction filter, a filter coefficient, and the like) capable of identifying an assigned representative filter may be displayed to an image (icon and the like) representing the selection button.

For example, in the present embodiment, there are four correction filters (the correction filters F1 to F4) and two selection buttons. Therefore, the selector 30 divides the correction filters into a first group comprising the correction filters F1 and F2 and a second group comprising the correction filters F3 and F4, as the first filter group. Subsequently, the selector 30 selects, as the first-order representative filter, the correction filter F1 from the first-order filter group of the correction filters F1 and F2 and the correction filter F4 from the first-order filter group of the correction filters F3 and F4. Next, the selector 30 assigns information specifying the correction filter F1 to the selection button B1, and assigns information specifying the correction filter F4 to the selection button B2.

Here, for example, when the selection button B1 is pressed through the operation input module 32, the selector 30 outputs the selection signal for selecting the correction filter F1 assigned to the selection button B1 to the signal processor 13 and the filter processor 50. Consequently, the signal processor 13 outputs the test signal to which signal processing by the correction filter F1 is performed. As a result, the listener L who is wearing the earphone 120 can listen to the sound of the test signal.

Upon receipt of the press down operation of the enter button B3 after the correction filter F1 is selected, the selector 30 divides the first-order filter group (comprising the correction filters F1 and F2) to which the correction filter F1 belongs by two, which is a number of the selection buttons. As a result, a first group comprising the correction filter F1 and a second group comprising the correction filter F2 are generated as the second filter groups.

Then, when the selector 30 selects each of the correction filters F1 and F2 as the second-order representative correction filters, the selector 30 assigns information specifying the correction filter F1 to the selection button B1 and assigns information specifying the correction filter F2 to the selection button B2.

Here, for example, when the selection button B2 is pressed through the operation input module 32, the selector 30 outputs the selection signal for selecting the correction filter F2 assigned to the selection button B2 to the signal processor 13 and the filter processor 50. Consequently, the signal processor 13 outputs a test signal to which signal processing by the correction filter F2 is performed. As a result, the listener L wearing the earphone 120 can listen to the sound of the test signal. When the enter button B3 is pressed after the correction filter F2 is selected, the selector 30 deletes the UI displayed on the display module 31.

As described above, the selector 30 hierarchically divides the plurality of the correction filters based on the number of the selection buttons, and assigns one of the correction filters selected from the correction filters of the same hierarchical group to the selection item. As a result, the UI is provided for the listener L, and the listener L can select one correction filter from a higher hierarchical group to a lower hierarchical group. Consequently, the listener L can easily compare the difference in the sound quality between the cases when different correction filters are applied, thereby becomes capable of selecting a desired correction filter by intuitive operation.

Further, a number of times required to listen to the test sound can be reduced to make the final decision, thereby the listener's burden can be alleviated.

Referring back to FIG. 2, the acoustic signal generator 40 generates digital audio signal from acoustic data (music data, audio data, and the like) stored in a memory not illustrated, analog acoustic signals input from an external device, or the like, and output it to the filter processor 50. Further, upon receipt of an input of an operation to start changing the configuration of the sound quality correction through the operation input module 32, the acoustic signal generator 40 starts generating the test signal, and outputs it to the signal processor 13.

As the test signal, for example, white noise and an audio signal such as music obtained from a memory or an external input can be used. Further, when compressed data such as audio encoded data, voice-encoded data, lossless encoded data, or the like is to be used, the test signal can be the audio wave signals or the like obtained by performing necessary decoding on the compressed data.

The filter processor 50 comprises: a holder such as a storage medium or the like holding a plurality of correction filters (correction filters F1 to F4) with the properties the same as that of the correction filters of the signal processor 13; and a module configured to change the frequency property of the acoustic signal by using one of the correction filters stored in the holder. Further, upon receipt of the selection signal from the selector 30, the filter processor 50 holds a correction filter corresponding to the selection signal as a correction filter to be used for the sound quality correction of the acoustic signal input from the acoustic signal generator 40. Then, the filter processor 50 changes the frequency property of the acoustic signal by using the correction filter held for the sound quality correction, and outputs it to the converter 20.

In the following, operation of the acoustic processor 100 for configuration change of the correction filter is explained with reference to FIGS. 13 to 15.

Figure 13A:
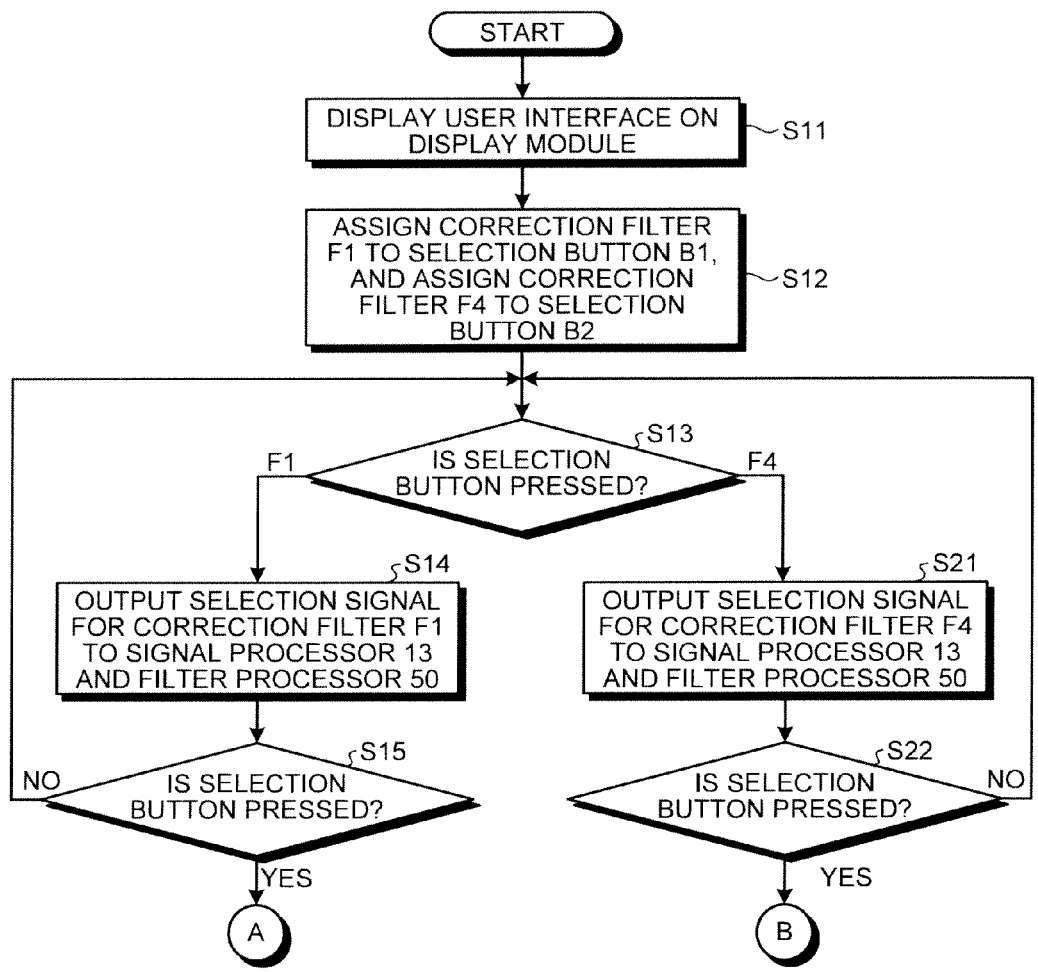
FIG. 13 is a flowchart of filter change process in the embodiment.
Figure 13B:
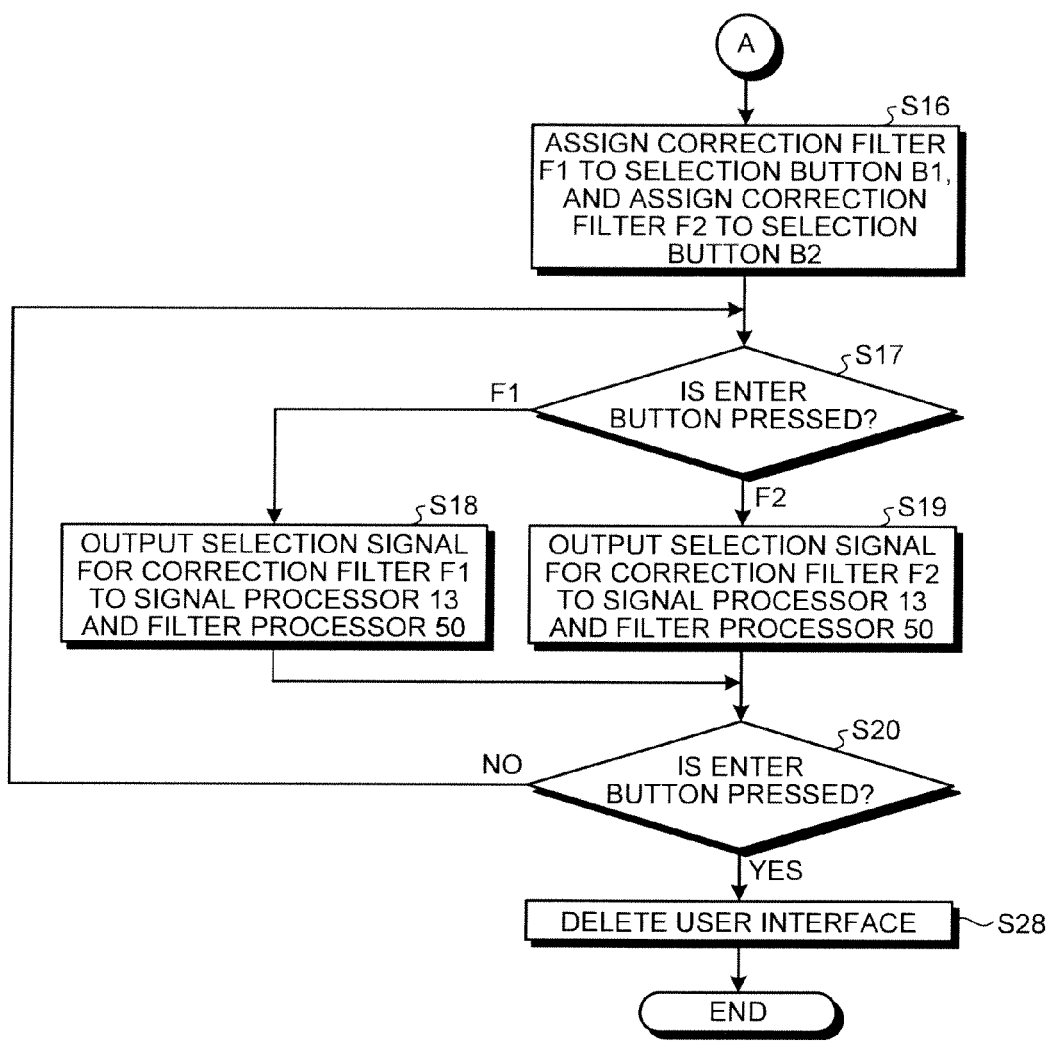
Figure 13C:
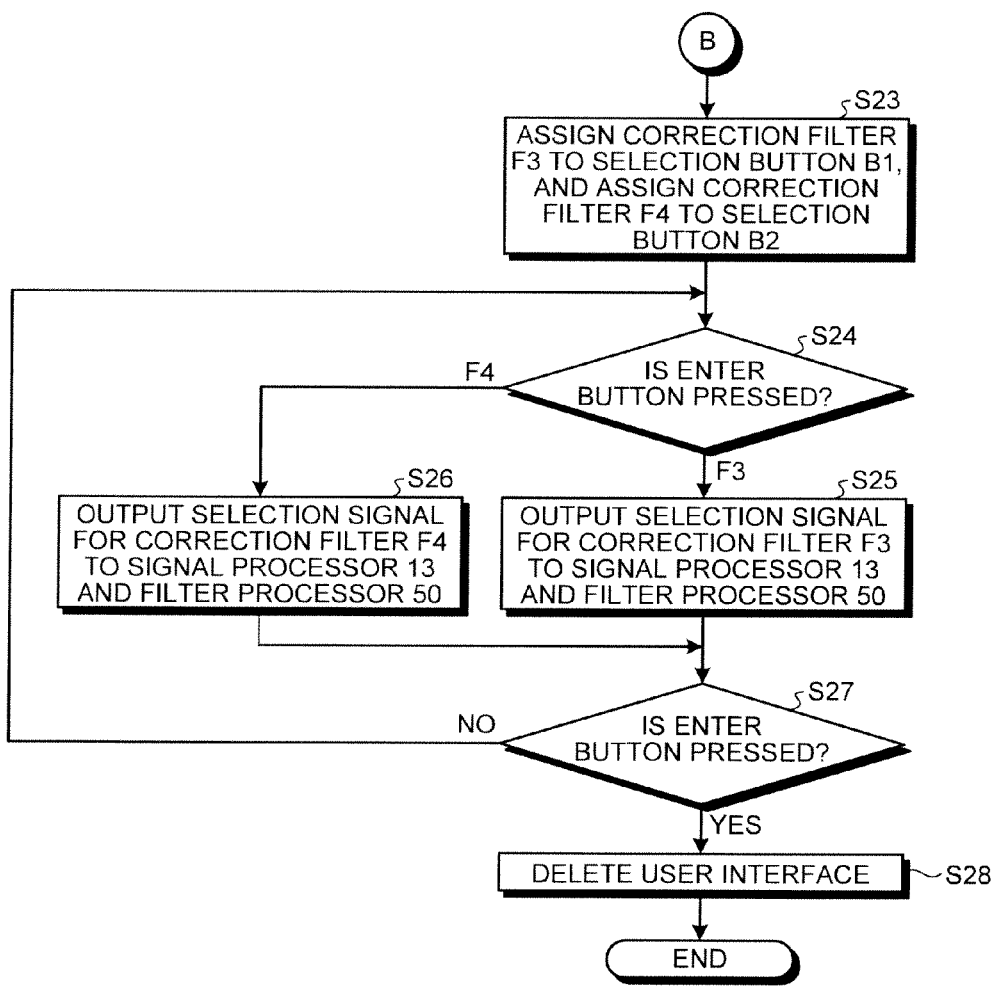

FIG. 13 is a flowchart illustrating one example of filter changing process executed by the selector 30. For the process, it is assumed that an operation for start changing the configuration of the sound quality correction is input through the operation input module 32.

When the UI illustrated in FIG. 12 is displayed on the display module 31 (S11), the selector 30 assigns information specifying the correction filter F1 to the selection button B1 comprised in the UI, and also assigns information specifying the correction filter F4 to the selection button B2 (S12).

When the selector 30 receives the press down operation of the selection button B1 (F1 at S13), the selector 30 outputs the selection signal for selecting the correction filter F1 assigned to the selection button B1 to the signal processor 13 and the filter processor 50 (S14). Next, the selector 30 determines whether the enter button B3 is pressed. When it is not confirmed that the enter button B3 is pressed (No at S15), the process goes back to S13.

When the selection button F1 is pressed at S13, the signal processor 13 changes the frequency property of the test signal by using the correction filter F1. As a result, a sound in which the resonant phenomenon is suppressed by the correction filter F1 is heard from the earphone 120. The listener L presses the selection buttons B1 and B2, and determines his/her preference on the sound quality based on the sound generated by the earphone 120. When the preferred sound quality is determined, the enter button B3 is pressed.

Upon receipt of the press down operation of the enter button B3 (Yes at S15) after the selection of the correction filter F1 is received at S13, the selector 30 assigns the information specifying the correction filter F1 to the selection button B1, and the information specifying the correction filter F2 to the selection button B2 (S16).

Here, upon receipt of the press down operation of the selection button B1 (F1 at S17), the selector 30 outputs the selection signal for selecting the correction filter F1 assigned to the selection button B1 to the signal processor 13 and the filter processor 50 (S18). Next, the selector 30 determines whether the enter button B3 is pressed. When it is not confirmed that the enter button B3 is pressed (No at S20), the process goes back to S17.

When the selection button B1 is pressed at S17, the selector 30 changes the frequency property of the test signal by using the correction filter F1. Accordingly, a sound in which the resonance phenomenon is suppressed by the correction filter F1 is generated from the earphone 120. The listener L presses the selection buttons B1 and B2, and determines his/her preference on the sound quality based on the sound generated by the earphone 120. When the preferred sound quality is determined, the enter button B3 is pressed.

Upon receipt of the enter button B3 (Yes at S20) after the selection of the correction filter F1 at S17, the UI displayed on the display module 31 is deleted (S28). Then, the present process finishes.

Upon receipt of the press down operation of the selection button B2 at S17 (F2 at S17), the selector 30 outputs the selection signal for selecting the correction filter F2 assigned to the selection button B2 to the signal processor 13 and the filter processor 50 (S19). Next, the selector 30 determines whether the enter button B3 is pressed. As a result, when it is not confirmed that the enter button B3 is not pressed down (No at S20), the process goes back to S17.

When the selection button B2 is pressed at S17, the signal processor 13 changes the frequency property of the test signal by using the correction filter F2. As a result, a sound in which the resonance phenomenon is suppressed by the correction filter F2 is generated from the earphone 120. The listener L determines his/her preference on the sound quality based on the sound generated by the earphone 120. When the preferred sound quality is determined, the enter button B3 is pressed.

Upon receipt of the press down operation of the enter button B3 (Yes at S20) after the receipt of the selection filter F2 at S17, the selector 30 deletes the UI displayed on the display module 31 (S28), and finishes the process.

On the other hand, upon receipt of the press down operation of the selection button B2 at S13 (F4 at S13), the selector 30 outputs the selection signal for selecting the correction filter F4 assigned to the selection button B2 to the signal processor 13 and the filter processor 50 (S21). Next, the selector 30 determines whether the enter button B3 is pressed. As a result, when it is not confirmed that the enter button B3 is pressed (No at S22), the process goes back to S13.

When the selection button B2 is pressed at S13, the signal processor 13 changes the frequency property of the test signal by using the correction filter F4. Therefore, a sound in which the resonance phenomenon is suppressed by the correction filter F4 is generated from the earphone 120. The listener L determines his/her preference on the sound quality based on the sound generated from the earphone 120. When the preferred sound quality is determined, the enter button B3 is pressed.

Upon receipt of the press down operation of the enter button B3 (Yes at S22) after the selection of the correction filter F4 at S13, the selector 30 assigns the information for selecting the correction filter F3 to the selection button B1, and assigns the information for selecting the correction filter F4 to the selection button B2 (S23).

Upon receipt of the press down operation of the selection button B1 (F3 at S24), the selector 30 outputs the selection signal for selecting the correction filter F3 assigned to the selection button B1 to the signal processor 13 and the filter processor 50 (S25). Next, the selector 30 determines whether the enter button B3 is pressed. As a result, when it is not confirmed that the enter button B3 is pressed (No at S27), the process goes back to S24.

When the selection button B1 is pressed at S24, the signal processor 13 changes the frequency property of the test signal by the correction filter F3. Accordingly, a sound in which the resonance phenomenon is suppressed by the correction filter F3 is generated from the earphone 120. The listener L presses the selection buttons B1 and B2, and determines his/her preference on the sound quality based on the sound generated by the earphone 120. When the preferred sound quality is determined, the enter button B3 is pressed.

Upon receipt of the press down operation of the enter button B3 (Yes at S27) after the receipt of the selection of the correction filter F3 at S24, the selector 30 deletes the UI displayed on the display module 31, and the process ends.

Further, upon receipt of the press down operation of the selection button B2 at S24 (F4 at S24), the selector 30 outputs the selection signal for selecting the correction filter F4 assigned to the selection button B2 to the signal processor 13 and the filter processor 50 (S26). Next, the selector 30 determines whether the enter button B3 is pressed. When it is not confirmed that the enter button B3 is pressed down (No at S27), the process flows back to S24.

When the selection button B2 is pressed at S24, the signal processor 13 changes the frequency property of the test signal by using the correction filter F4. Therefore, a sound in which the resonance phenomenon is suppressed by the correction filter F4 is generated from the earphone 120. The listener L determines his/her preference on the sound quality based on the sound generated by the earphone 120. When the preferred sound quality is determined, the enter button B3 is pressed.

Upon receipt of the press down operation of the enter button B3 (Yes at S27) after the receipt of the selection of the correction filter F4 at S24, the selector 30 deletes the UI displayed on the display module 31 (S28), and finishes the process.

Figure 14:
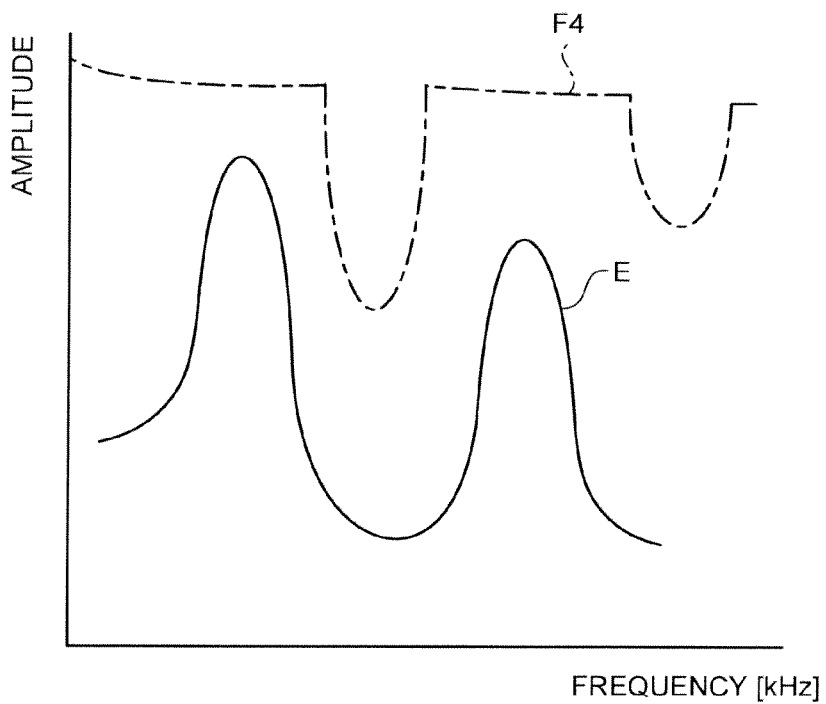
FIG. 14 is a graph for explaining the filter change process in the embodiment.
Figure 15:
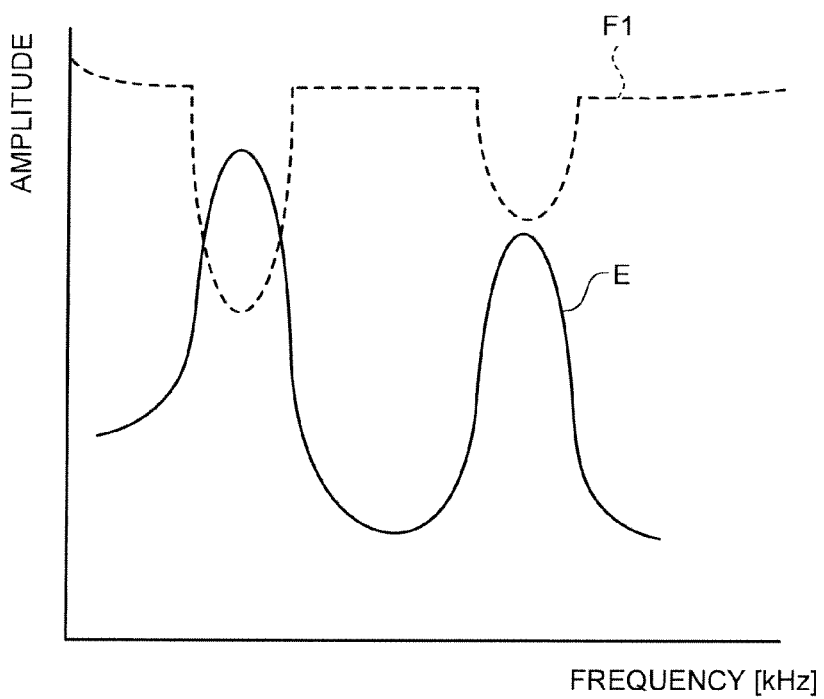
FIG. 15 is an another graph for explaining the filter change process in the embodiment.

FIGS. 14 and 15 are graphs for explaining the aforementioned filter changing process. In FIGS. 14 and 15, the solid line represents an ear property E of the listener L wearing the earphone 120. As illustrated in FIG. 14, when the correction filter F4 is applied in the signal processor 13 as the configuration of the sound quality correction, the resonance peak of the ear property E cannot effectively be suppressed. Hence, the listener L hears the test signal influenced by the resonance phenomenon. In this case, the listener L hears loud or annoying test sound. On the other hand, as illustrated in FIG. 15, when the correction filter F1 capable of effectively suppressing the resonance peak is applied at the signal processor 13, the listener L hears the test sound in which the resonance phenomenon is reduced. In this case, in comparison to the case of FIG. 14, the listener L hears the test sound with reduced loudness or the annoyance. Hence, it becomes capable of selecting a correction filter based on the listener's feeling such as the loudness or the annoyance, thereby no complicated determination such as the determination of where to listen is required.

As described above, the listener L uses the UI displayed on the display module 31 by the aforementioned filter changing process, and compares the sound qualities of the test signal to which the signal processing by each of the correction filters is performed, to change the configuration. Accordingly, the listener L can select a correction filter based on instinctive standard of whether the sound is loud or annoying, and the determination of where to listen to becomes unnecessary. Further, as illustrated in FIG. 15, it becomes capable of easily selecting a correction filter capable of effectively suppressing the resonance peak of the ear property E. Consequently, an appropriate filter is to be applied to the filter processor 50, and the listener L can enjoy high definition sound quality by listening to the acoustic signal to which the correction suitable for the ear property of the listener L is performed, through the earphone 120.

According to the embodiment, an acoustic signal corrector and an acoustic signal correcting method capable of suppressing the resonance phenomenon induced by sealing the ear canal and capable of easily producing high quality sound can be provided.

In the embodiment, each of the correction filters are preliminarily stored as the correction configurations of the acoustic signal (test signal), and the correction filters are used to change the frequency property of the test signal. However, the embodiment is not limited thereto, and for example, only values (cutoff frequency, Q value, or the like) representing characteristic of each of the correction filters, can be stored, and the each of the correction filters can be generated based on the values.

Further, in the embodiment, the amplitude value (resonance peak) of the acoustic signal is suppressed (reduced) by using the correction filters. However, the embodiment is not limited thereto, and the other correction (for example, increasing) can be performed. For example, components other than the components of the frequencies within the frequency band comprising the resonance peak can be increased to perform correction so that the frequency components corresponding to the resonance peak does not stand out with respect to the components of frequencies within other frequency band.

Further, in the embodiment, the frequency band extractor 11 and the adder 12 are provided separately. However, the embodiment is not limited thereto, and the frequency band extractor 11 and the adder 12 can be realized by a single processor. Further, the frequency band extractor 11, the adder 12, and the signal processor 13 can be realized by a single processor. In this case, in comparison to the configuration illustrated in FIG. 2, a number of signal processing performed on the acoustic signal (test signal) can be reduced, and the circuit configuration can be simplified. As a result, the effect of the aforementioned embodiment can be achieved by a simpler configuration.

Further, in the embodiment, the acoustic signal generator 40 generates the test signal, and the frequency band extractor 11 and the adder 12 increases components of frequencies within the frequency band within which the resonance is possibly induced by sealing the ear canal. However, the embodiment is not limited thereto. For example, as illustrated in FIG. 16, an acoustic signal similar to the test signal output from the adder 12 can preliminarily be stored in a storage medium. Then, a test signal is generated based on the acoustic signal stored in the storage medium, and the generated test signal is heard by the listener L as the test sound.

FIG. 16 is a block diagram illustrating a configuration of an acoustic processor 200, which is another embodiment of the acoustic processor 100. As illustrated in FIG. 16, the acoustic processor 200 comprises an acoustic reproducer 130 corresponding to the acoustic reproducer 110 and the earphone 120. The acoustic reproducer 130 differs from the acoustic reproducer 110 in terms of a configuration of a test signal generator 60, and comprises: a storage module 61 storing an acoustic signal similar to a test signal output from the adder 12; and a signal processor 62.

When the acoustic signal stored in the storage module 61 is read, the signal processor 62 perform process for changing frequency property of the acoustic signal by using the correction filter corresponding to the selection signal from the selector 30. Then, the signal processor 62 outputs it to the converter 20 as the test signal.

In comparison to the configuration of FIG. 2, when the configuration of the acoustic processor 200 is used, a number of process performed on the acoustic signal (test signal) can be decreased, and also the circuit configuration can be simplified. Therefore, the effect similar to that of the aforementioned embodiment can be expected by the simpler configuration.

Further, in the configuration of the acoustic processor 200, the test signal to which the process by the each of the correction filters F1 to F4 is performed can be stored in the storage module 61. In this case, the signal processor 62 reads the acoustic signal to which the process using the correction filter corresponding to the selection signal from the selector 30 is performed from the storage module 61, and outputs it to the converter 20 as the test signal. Consequently, the effect similar to the above can be obtained.

In the embodiment, the signal processor 13 and the filter processor 50 are provided separately. However, the embodiment is not limited thereto, and as illustrated in FIG. 17, a filter processor 80 corresponding to the filter processor 50 can be used to generate the test signal.

FIG. 17 is a block diagram of a configuration of an acoustic processor of still another embodiment of the acoustic processor 100. As illustrated in FIG. 17, an acoustic processor 300 comprises: an acoustic reproducer 140 corresponding to the acoustic reproducer 110; and the earphone 120. The acoustic reproducer 140 differs from the acoustic reproducer 110 in terms of the configuration of a test signal generator 70, and in the acoustic reproducer 140, the signal processor 13 is removed from the test signal generator 10. Further, the filter processor 80 corresponding to the filter processor 50 receives the test signal from the adder 12, and the frequency property is changed by using the correction filter corresponding to the selection signal form the selector 30. Here, in the test signal generator 70, the frequency band extractor 11 and the adder 12 can be replaced by the storage module 61 of FIG. 16.

In comparison to the case when the configuration of FIG. 2 is used, when the configuration of the acoustic processor 300 is used, the circuit configuration can be simplified, thereby an effect similar to that of the aforementioned embodiment can be obtained by simpler configuration.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An acoustic signal corrector, comprising:
an output module configured to output a plurality of acoustic signals, amplitude values within a frequency band of each of the acoustic signals being emphasized as emphasized amplitude values, a plurality of amplitude values among the emphasized amplitude values being corrected as corrected amplitude values at corresponding frequency positions, resonance being induced in the frequency band by sealing an ear canal;
a selection receiver configured to receive a selection of one of the acoustic signals output by the output module; and
a holder configured to hold, as a configuration for sound quality correction, a configuration corresponding to the correction at the frequency positions of the one of the acoustic signals.

2. The acoustic signal corrector of claim 1, wherein the output module comprises:
an amplifier configured to extract frequency components of each of the acoustic signals within the frequency band, and add the frequency components to the each of the acoustic signals within the frequency band; and
a signal processor configured to output the acoustic signals each with the corrected amplitude values corrected at the frequency positions within the frequency band processed by the amplifier.

3. The acoustic signal corrector of claim 2, wherein the amplifier comprises:
an extractor configured to extract the frequency components of each of the acoustic signals within the frequency band;
an adder configured to add the frequency components extracted by the extractor to the each of the acoustic signals within the frequency band.

4. The acoustic signal corrector of claim 1, wherein the output module comprises:
a first storage module configured to store each of the acoustic signals comprising the emphasized amplitude values; and
a signal processor configured to output each of the acoustic signals stored in the first storage module, the amplitude values among the emphasized amplitude values of the each of the acoustic signals stored in the first storage module being corrected at the frequency positions as the corrected amplitude values.

5. The acoustic signal corrector of claim 1, wherein the output module comprises:
a storage module configured to store each of the acoustic signals comprising the corrected amplitude values corrected at the corresponding frequency positions; and
a signal output module configured to output the each of the acoustic signals stored in the storage module.

6. The acoustic signal corrector of claim 1, wherein the correction of each of the amplitude values at the frequency positions reduces amplitude values within a band portion with each of the frequency positions at a center thereof.

7. The acoustic signal corrector of claim 1, wherein
the selection receiver is configured to provide a selection item for receiving the selection, the configuration for the correction being assigned to the selection item, and
the output module is configured to output one of the acoustic signals in which the amplitude values among the emphasized amplitude values are corrected at the frequency positions corresponding to the configuration assigned to the selection item received by the selection receiver.

8. The acoustic signal corrector of claim 7, wherein the selection receiver is configured to hierarchically divide the configuration instructing to correct the amplitude values at the frequency positions into groups based on a number of selection items, and assign one configuration selected from a same hierarchical group for each of the items to provide a user interface receiving a selection of one configuration for an upper hierarchical group to an lower hierarchical group.

9. An acoustic signal correcting method, comprising:
outputting, by an output module, a plurality of acoustic signals, amplitude values within a frequency band of each of the acoustic signals being emphasized as emphasized amplitude values, a plurality of amplitude values among the emphasized amplitude values being corrected as corrected amplitude values at corresponding frequency positions, resonance being induced in the frequency band by sealing an ear canal;
receiving, by a selection receiver, a selection of one of the acoustic signals output by the output module; and
holding, by a holder, as a configuration for sound quality correction, a configuration corresponding to the correction at the frequency positions of the one of the acoustic signals.

10. An acoustic signal corrector, comprising:
an output module configured to process a plurality of acoustic signals, amplitude values within a frequency band of each of the plurality of acoustic signals being emphasized as emphasized amplitude values, a plurality of amplitude values among the emphasized amplitude values being corrected as corrected amplitude values at corresponding frequency positions;
a selection receiver configured to receive one of the plurality of acoustic signals output by the output module;
a storage unit configured to store, as a configuration for sound quality correction, a configuration corresponding to the correction at the frequency positions of the one of the plurality of acoustic signals; and
an earphone configured to be adapted to seal an ear canal of a listener to induce resonance in the frequency band.

11. The acoustic signal corrector of claim 10, wherein the output module comprises:
an amplifier configured to extract frequency components of each of the plurality of acoustic signals within the frequency band, and to add the frequency components to the each of the plurality of acoustic signals within the frequency band; and
a signal processor configured to output the plurality of acoustic signals each with the corrected amplitude values corrected at the frequency positions within the frequency band processed by the amplifier.

12. The acoustic signal corrector of claim 11, wherein the amplifier comprises:
an extractor configured to extract the frequency components of each of the plurality of acoustic signals within the frequency band;
an adder configured to add the frequency components extracted by the extractor to the each of the plurality of acoustic signals within the frequency band.

13. The acoustic signal corrector of claim 10, wherein the output module comprises:
a first storage module configured to store each of the plurality of acoustic signals comprising the emphasized amplitude values; and
a signal processor configured to output each of the plurality of acoustic signals stored in the first storage module, the amplitude values among the emphasized amplitude values of the each of the plurality of acoustic signals stored in the first storage module being corrected at the frequency positions as the corrected amplitude values.

14. The acoustic signal corrector of claim 10, wherein the output module comprises:
a storage module configured to store each of the plurality of acoustic signals comprising the corrected amplitude values corrected at the corresponding frequency positions; and
a signal output module configured to output the each of the plurality of acoustic signals stored in the storage module.

15. The acoustic signal corrector of claim 10, wherein the correction of each of the amplitude values at the frequency positions reduces amplitude values within a band portion with each of the frequency positions at a center thereof.

16. The acoustic signal corrector of claim 10, wherein
the selection receiver is configured to provide a selection item for receiving the selection, the configuration for the correction being assigned to the selection item, and
the output module is configured to output one of the plurality of acoustic signals in which the amplitude values among the emphasized amplitude values are corrected at the frequency positions corresponding to the configuration assigned to the selection item received by the selection receiver.

17. The acoustic signal corrector of claim 16, wherein the selection receiver is configured to hierarchically divide the configuration instructing to correct the amplitude values at the frequency positions into groups based on a number of selection items, and assign one configuration selected from a same hierarchical group for each of the items to provide a user interface receiving a selection of one configuration for an upper hierarchical group to an lower hierarchical group.

18. The acoustic signal corrector of claim 10, wherein the selection receiver includes a converter.

19. The acoustic signal corrector of claim 10, wherein the output module is a test signal generator.

* * * * *